(12) United States Patent
Ju

(10) Patent No.: US 6,344,971 B1
(45) Date of Patent: Feb. 5, 2002

(54) RETAINER FOR A RETAINING SEAT OF A RADIATOR

(76) Inventor: Ted Ju, No. 15, Wu Shiunn St., An Leh District, Keelung City (TW)

( * ) Notice: Subject to any disclaimer, the term of this patent is extended or adjusted under 35 U.S.C. 154(b) by 0 days.

(21) Appl. No.: 09/737,475

(22) Filed: Dec. 18, 2000

(51) Int. Cl.⁷ ................................................. H05K 7/20
(52) U.S. Cl. ....................... 361/704; 361/707; 361/709; 361/710; 165/80.2; 165/80.3; 165/185; 174/16.3; 257/718; 257/719; 257/722; 257/727
(58) Field of Search ................................ 361/688, 690, 361/703, 704, 709, 710, 717–720; 257/706, 717–719, 722, 724; 174/16.3; 165/80.3, 185

(56) References Cited

U.S. PATENT DOCUMENTS

| | | | | |
|---|---|---|---|---|
| 5,323,845 A | * | 6/1994 | Kin-shon | 165/80.3 |
| 5,477,916 A | * | 12/1995 | Lin | 165/80.3 |
| 5,493,475 A | * | 2/1996 | Lin | 361/710 |
| 5,678,627 A | * | 10/1997 | Lee | 165/80.3 |
| 5,684,676 A | * | 11/1997 | Lin | 361/704 |
| 5,771,155 A | * | 6/1998 | Cook | 361/710 |
| 5,808,236 A | * | 9/1998 | Brezina et al. | 174/16.3 |

* cited by examiner

*Primary Examiner*—Leo P. Picard
*Assistant Examiner*—Boris L. Chervinsky
(74) *Attorney, Agent, or Firm*—Bacon & Thomas

(57) ABSTRACT

A retainer for a retaining seat of a radiator serves to combine a CPU radiator to a PC circuit board. The retainer primarily includes two retaining seats and two pressing strips which are symmetrically installed at two sides of the retainer. One end of the pressing strip is pivotally installed to one end of the retaining seat, while another free end thereof is movable to be fixed with a groove of the retaining seat; thereby, the middle folded portion of the pressing strip is exactly engaged into a trench of a base of the radiator and is then formed with a steady engagement. Thereby, the radiator can be combined to a PC circuit board and thus, the retainer for a retaining seat of a radiator can be assembled and detached easily and conveniently.

6 Claims, 7 Drawing Sheets

RETAINER FOR A RETAINING SEAT OF A RADIATOR

FIELD OF THE INVENTION

The present invention relates to a retainer for a retaining seat of a radiator serving to combine a CPU radiator to a PC circuit board. The retainer primarily includes two retaining seats and two pressing strips. One end of the pressing strip is pivotally installed to one end of the retaining seat and is exactly engaged into a trench of a base of the radiator so as to be formed with a steady engagement therebetween.

BACKGROUND OF THE INVENTION

Referring to FIG. 1, a prior art retainer is illustrated. The prior art retainer mainly includes a metal radiating blade 10, a radiating fan 20 at the upper end thereof, a metal radiating base 30, two retaining seats 40 and two retaining seats 50 at two sides. The radiator is placed at upper end of a CPU. Two ends of two buckling pieces 50 and buckling holes 501 are embedded into the respective protrusion 401 of the retainer seat 40 so that the radiator can be successfully installed to the PC circuit board 60 (the upper surface of the CPU can be installed with a supporter 70 for fixing the radiator to the PC circuit.board). However, in the prior art retaining seat 40 and buckling piece 50, each set is engaged by three holes and thus, the work of buckling and engagement are hard.

SUMMARY OF THE INVENTION

Accordingly, the primary object of the present invention is to provide a retainer for a retaining seat of a radiator serving to combine a CPU radiator to a PC circuit board. The retainer primarily includes two retaining seats and two pressing strips which are symmetrically installed at two sides of the retainer. One end of the pressing strip is pivotally installed to one end of the retaining seat, while another free end thereof, the distal end is movable to be fixed with a groove of the retaining seat; thereby, the middle folded portion of the pressing strip is exactly engaged into a trench of a base of the radiator and is then formed with a steady engagement. Thereby, the radiator can be combined to a PC circuit board and thus, the retainer for a retaining seat of a radiator can be assembled and detached easily and conveniently.

The various objects and advantages of the present invention will be more readily understood from the following detailed description when read in conjunction with the appended drawing.

DETAILED DESCRIPTION OF THE PREFERRED EMBODIMENTS

Figure 1:
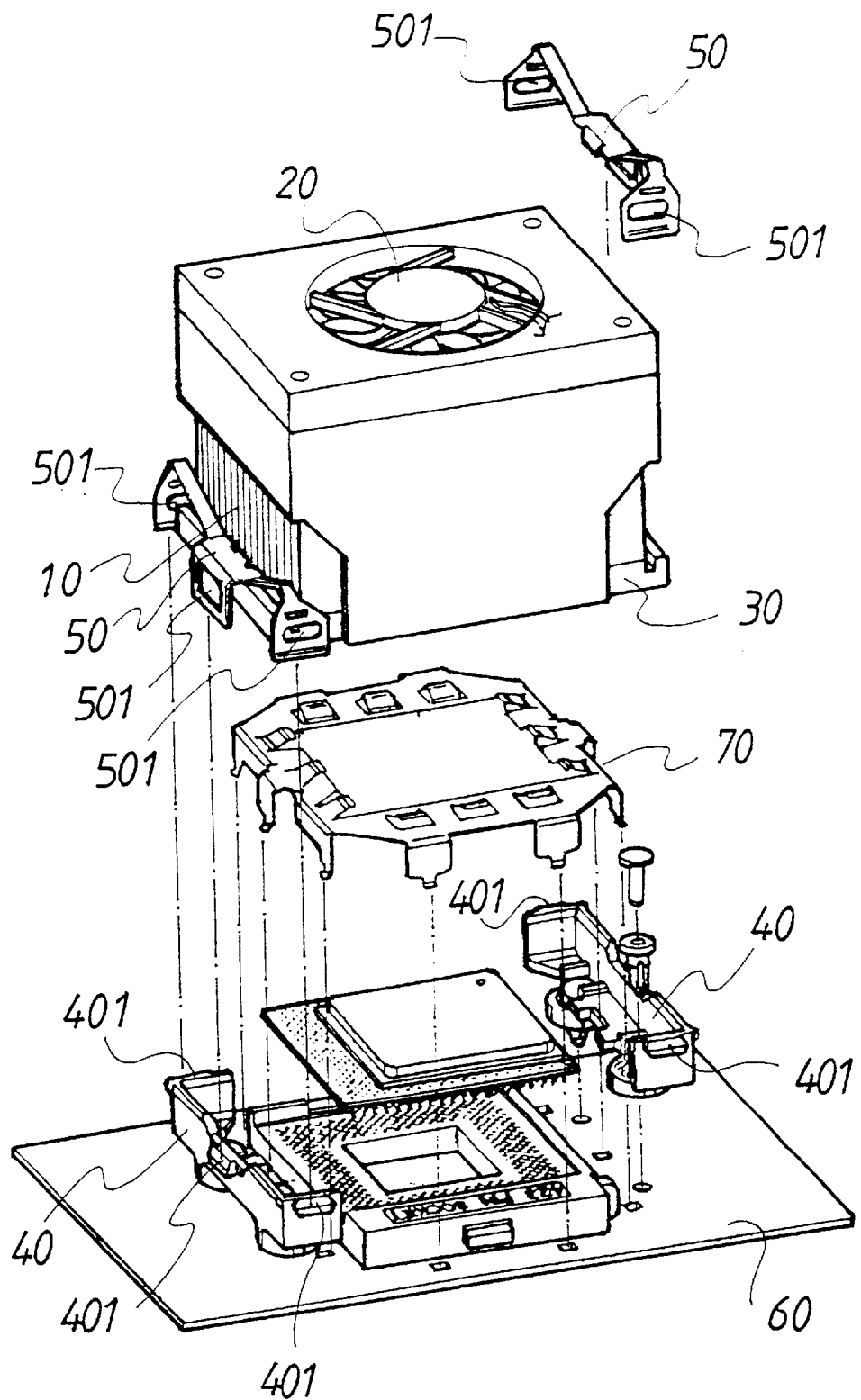
FIG. 1 is an exploded schematic view of a prior art radiator and retainer.
Figure 2:
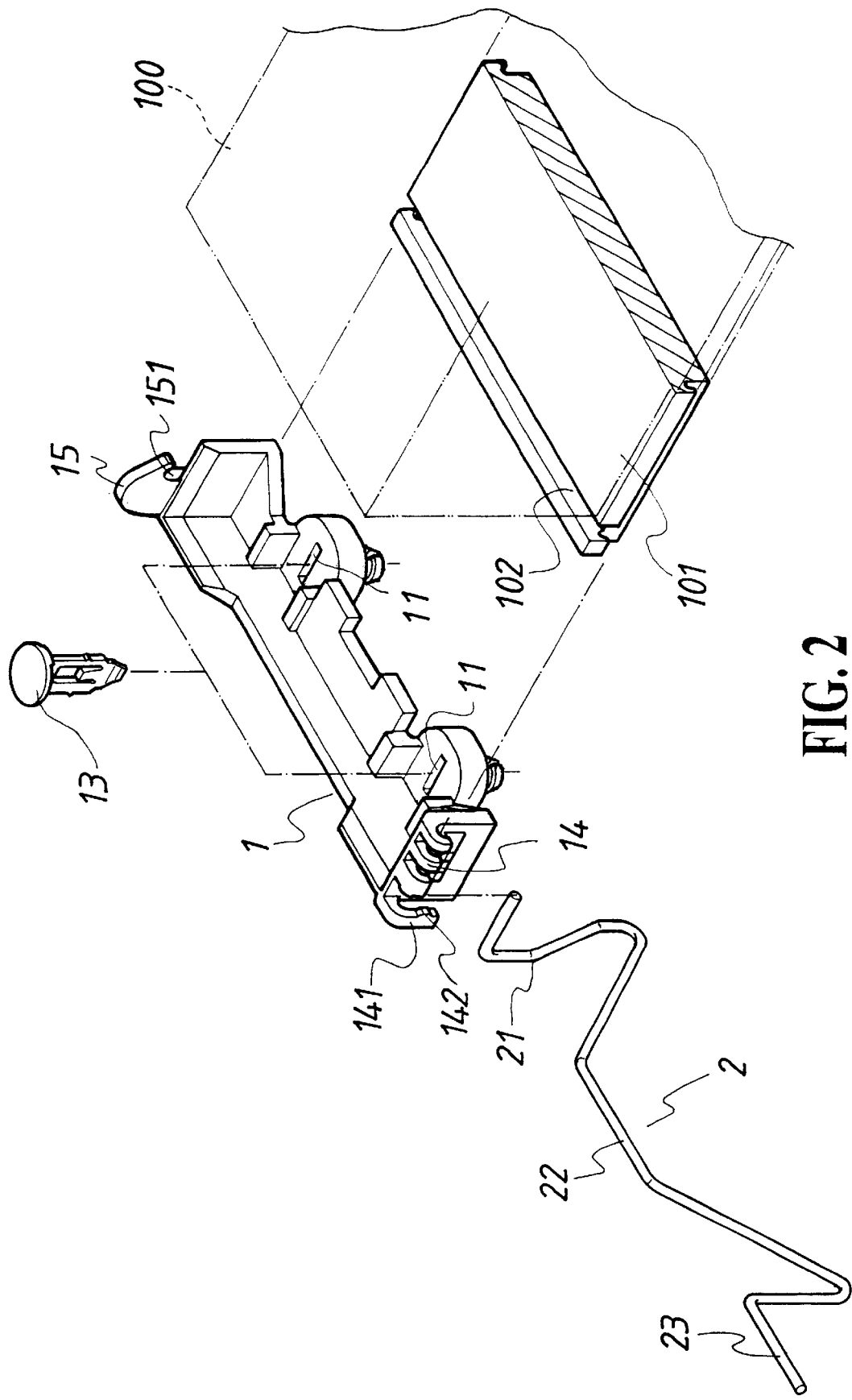
FIG. 2 is an exploded perspective view of the present invention.
Figure 3:
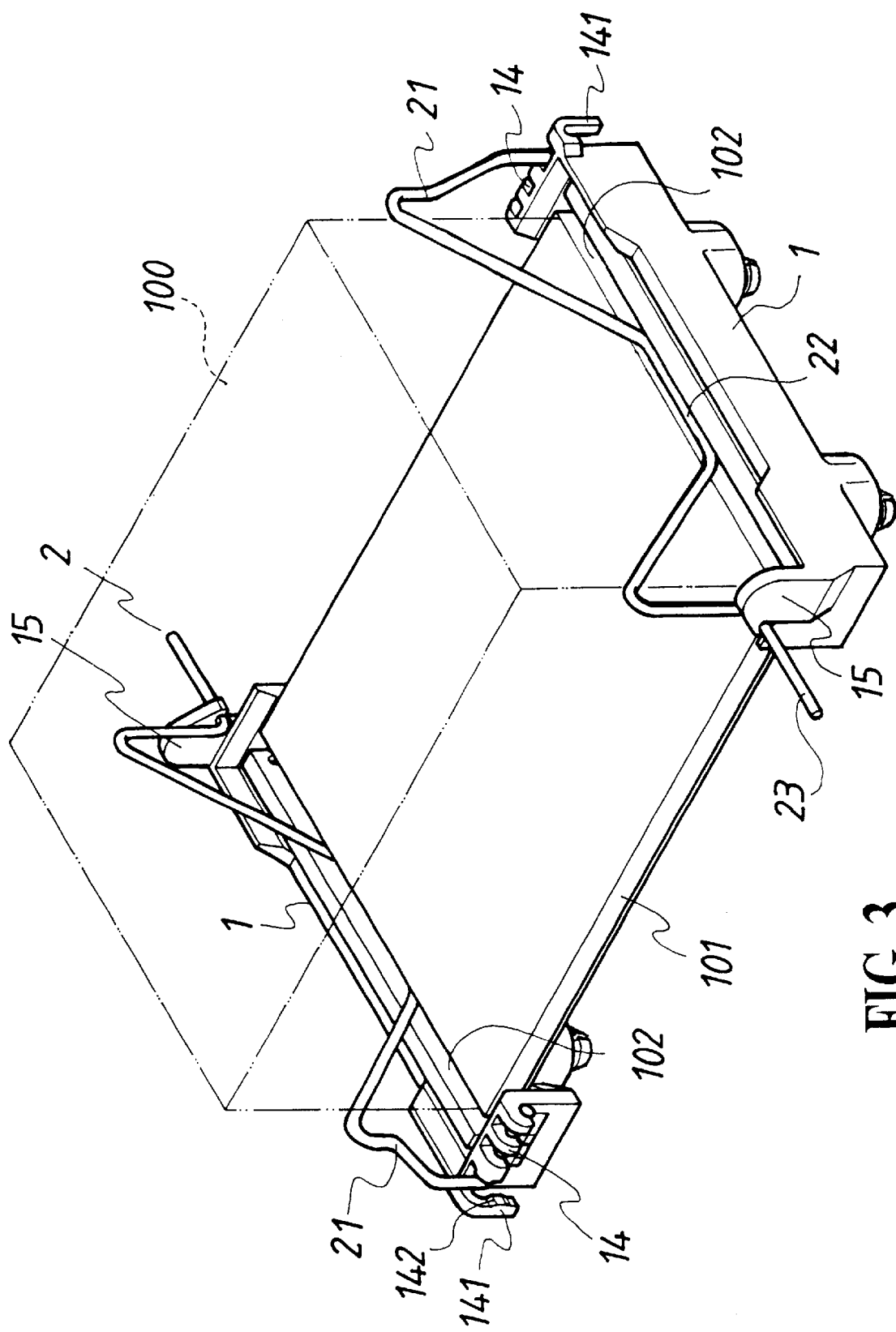
FIG. 3 is a schematic perspective view showing the assembly of the retainer in the present invention.

Referring to FIGS. 2 and 3, the retainer for a retaining seat of a radiator of the present invention is illustrated. The retainer is used to combine a CPU radiator 100 to a PC circuit board 200 so as to improve the assembly work of the radiator 100 with the PC circuit board 200. The retainer primarily includes two retaining seats I and two pressing strips 2 which are symmetrically installed at two sides of the retainer.

The retaining seat 1 is a seat capable of being placed at one side of the radiator 100. A lower end thereof is installed with proper engaging holes 11 for being engaged with prior art inserting sheets 13 so as to be combined with the PC circuit board 200 (referring to FIGS. 7 and 8). Two lateral sides of the retaining seat 1 are installed with a pivotal seat 14 and a buckling groove 151. The pivotal seat 14 has a front end with a stopper 141, while the groove 151 is formed with a stopping piece 15.

The pressing strip 2 is an elastic folded strip (such as a metal strip). A front end thereof is formed with a Z shape folded portion, a middle section thereof is folded through 90 degrees and has a protruded folded portion 22, and a distal end thereof is a horizontal extended folded portion 23.

Figure 5:
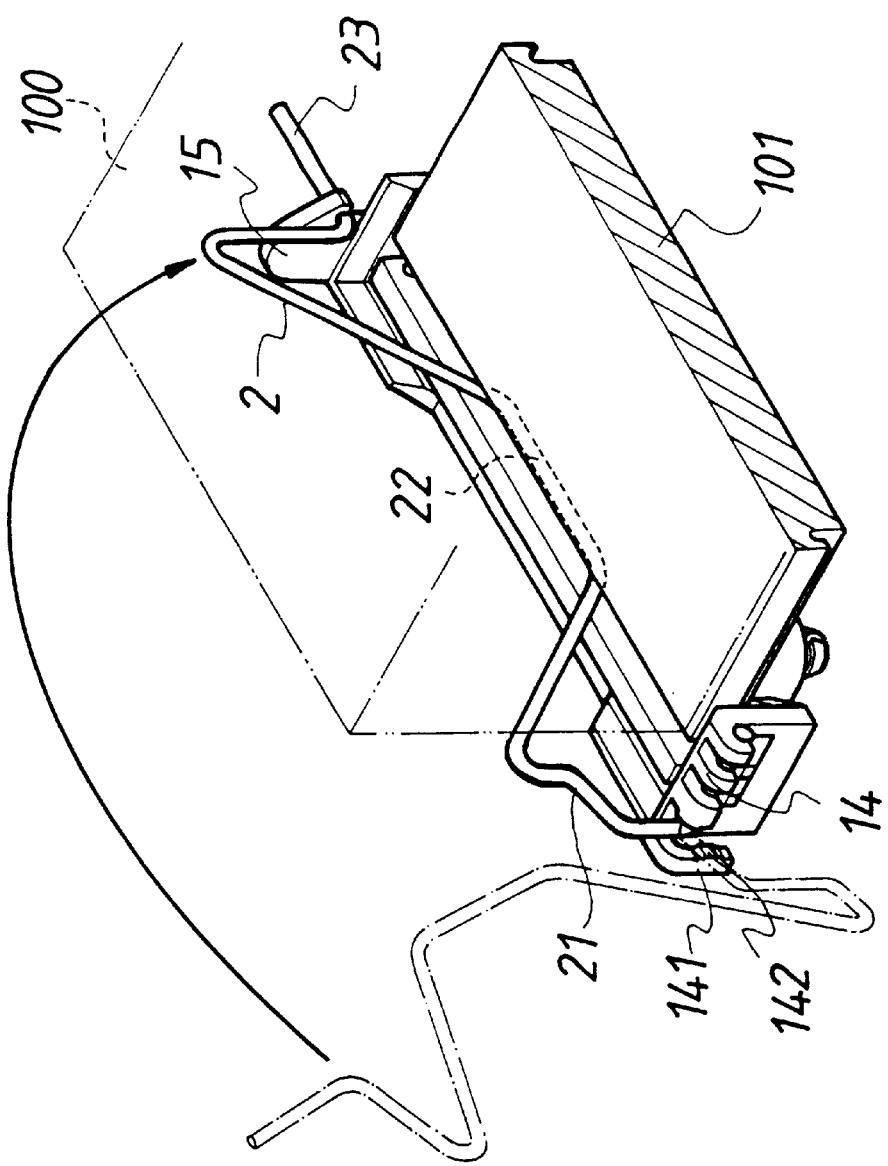
FIG. 5 is a schematic view showing the present invention which is assembled.
Figure 6:
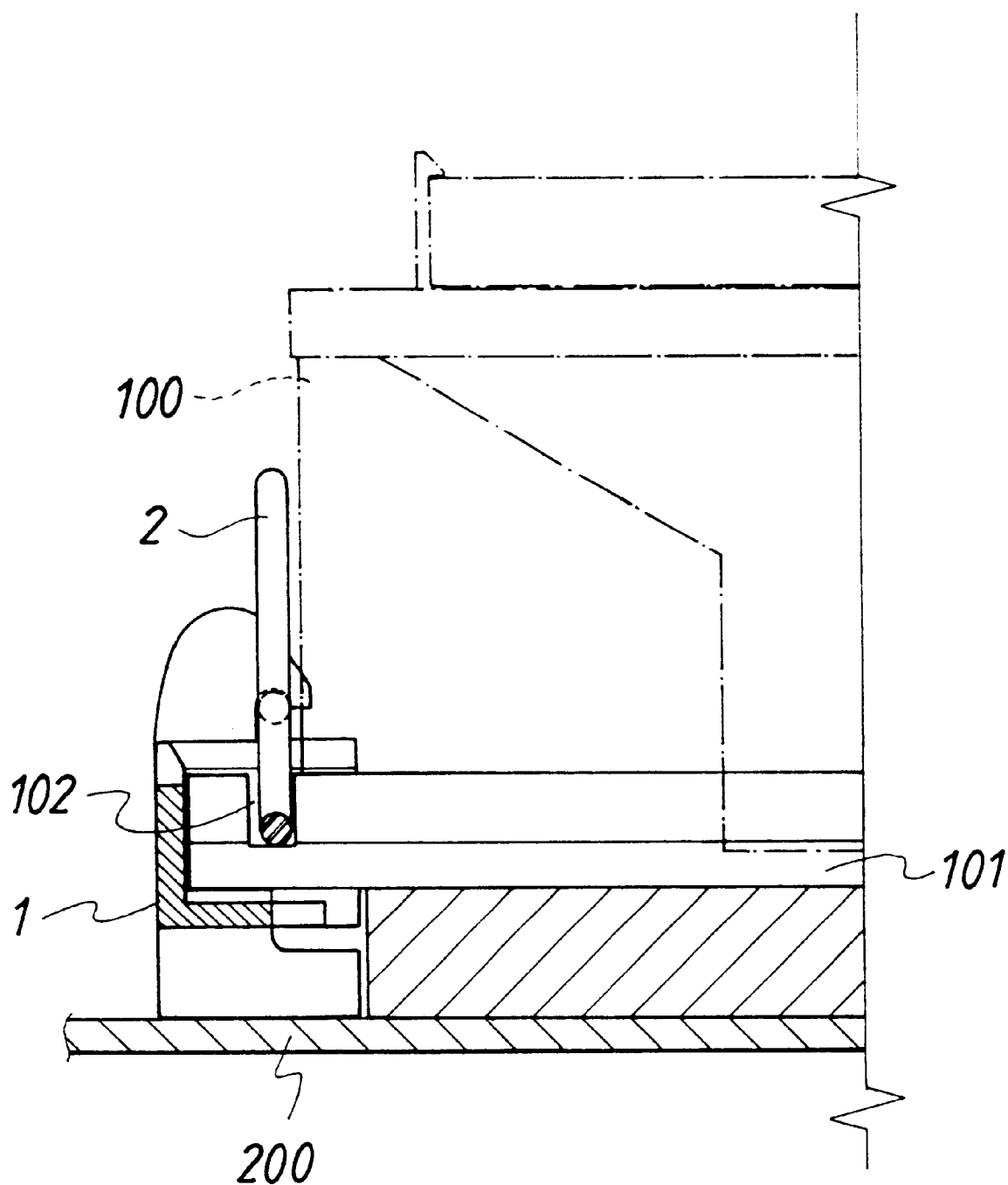
FIG. 6 is a transverse cross sectional view showing the present invention which is assembled.

By the aforesaid structure, the 7 shape folded portion 21 at a front end of the pressing strip 2 passes through the pivotal seat 14 of the retaining seat 1. The stopper 141 at the front end of the pivotal seat 14 serves to stop it from drop out. Therefore, one end of the pressing strip 2 is pivotally installed to one end of the retaining seat 1, while another end thereof (i.e., the distal end) is movable to be fixed with the groove 151 of the retaining seat I (referring to FIGS. 4 and 5). Thereby, the middle folded portion of the pressing strip 2 is exactly engaged into the trench 102 of a base 101 of the radiator 100 and is then formed with a steady engagement (referring to FIG. 6). Therefore, the radiator 100 can be combined with the PC circuit board 200 successfully. As such, for the assembly and detaching of the radiator 100, it is only necessary to move the pressing strip 2, the operation and use are convenient. Moreover, the middle folded portion 22 resists against the trench 102 of the base 101, and therefore, a preferred positioning is acquired and the combination thereof is steady.

Figure 4:
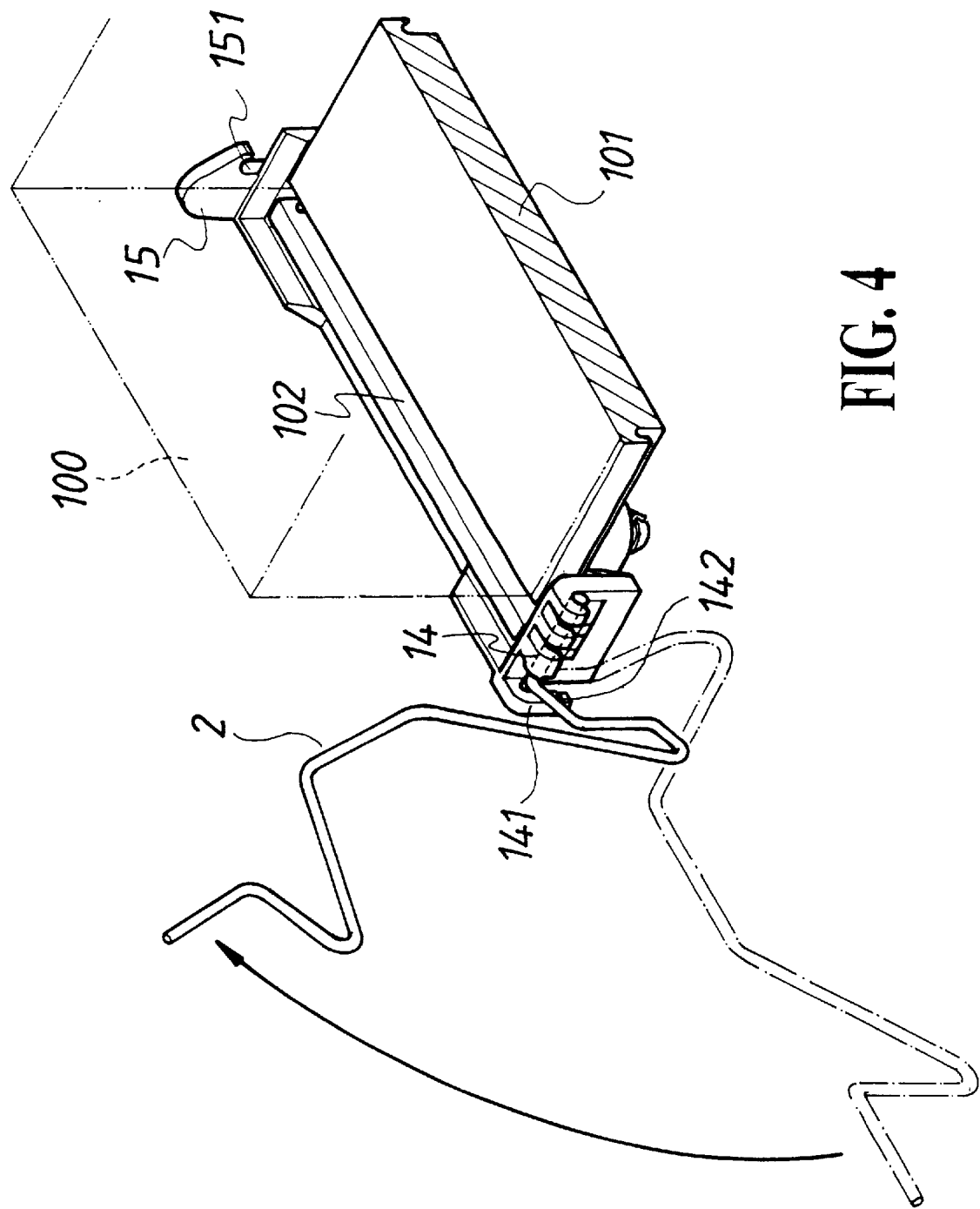
FIG. 4 is a schematic view showing the present invention which is not assembled.
Figure 7:
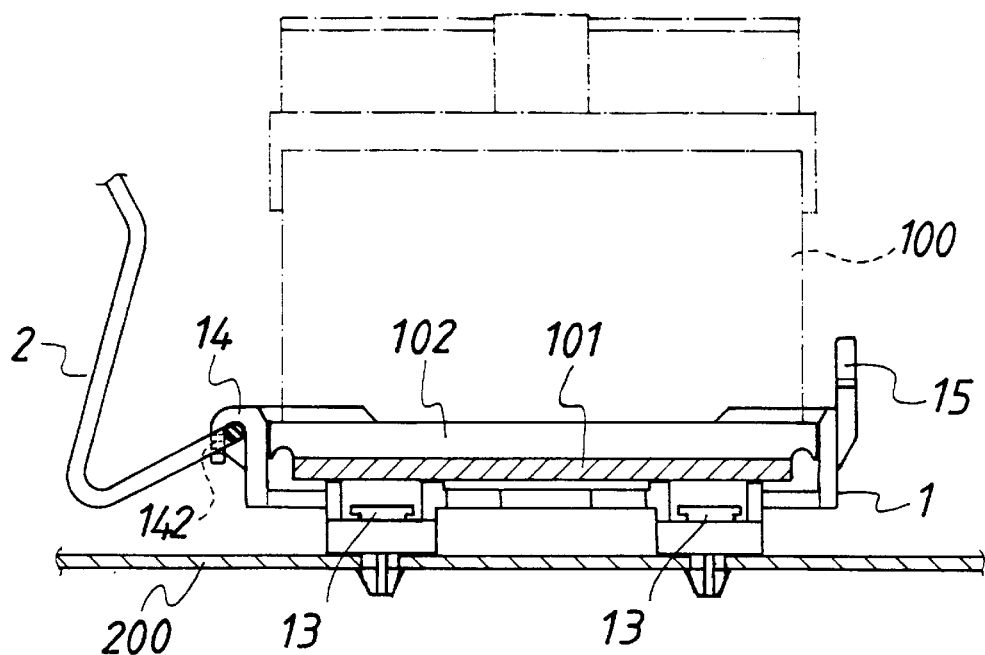
FIG. 7 is a cross sectional view showing the present invention which is not assembled.
Figure 8:
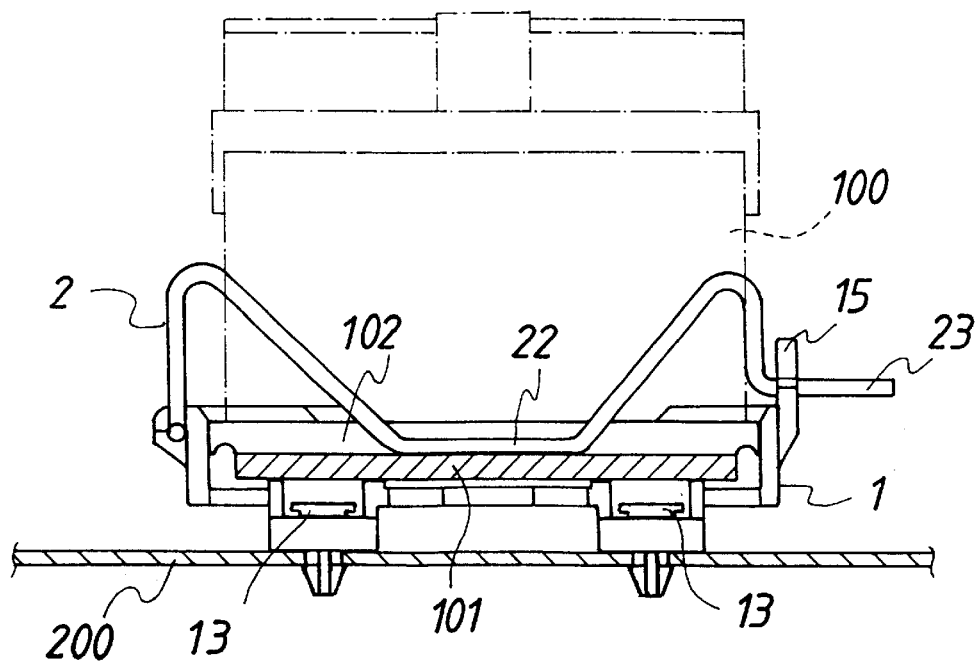
FIG. 8 is a longitudinal cross sectional view showing the present invention which is assembled.

In the assembly of the pressing strip 2 and the pivotal seat 14 of the retaining seat 1, the stopper 141 at the front end of the pivotal seat 14 can be formed with a block 142 at a contact end thereof so that as the pressing strip 2 rotates to a predetermined angle, the pressing strip 2 is exactly confined by the block 142 to be buckled therein (referring to FIGS. 4 or 7). As a result, the pressing strip 2 will not drop out from the pivotal seat 14. While aforesaid way is one way possible, other ways can be used for fixing the pressing strip 2 to the pivotal seat 14 and all these are within the scope of the present invention.

In summary, the retainer for a retaining seat of a radiator formed by assembling a pressing strip 2 to the retaining seat 1 has a simple structure. Especially, the easily movable pressing strip connected causes that the retainer and PC circuit board can be assembled and detached easily. After combining, the middle folded portion is tightly engaged so as to further improve the effect of the present invention.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A retainer for a retaining seat of a radiator for combining a CPU radiator to a PC circuit board, the retainer comprising:

two retaining seats and two pressing strips which are symmetrically installed at two sides of the retainer.

each one of said retaining seats is placed at one side of the radiator and each one of said retaining seats comprises two lateral sides, one lateral side further comprising a pivotal seat and the other lateral side further comprising a buckling groove:

each one of said pressing strips is an elastic folded strip comprising:

a front end passing through and pivotally installed into the pivotal seat of the retaining seat;

a distal end movable to be fixed in said buckling groove of the retaining seat; and a middle folded portion of the pressing strip inserted into a trench in a base of the radiator to form a steady clamping engagement.

2. The retainer for a retaining seat of a radiator as claimed in claim 1, wherein the buckling groove of the retainer seat comprises a stopping piece.

3. The retainer for a retaining seat of a radiator as claimed in claim 1, wherein the pressing strip is a metal elastic strip.

4. The retainer for a retaining seat of a radiator as claimed in claim 1, wherein said front end of the pressing strip is formed with a Z-shaped folded portion, the top of the Z-shaped portion forms a tip and is folded 90 degrees from the plane of the Z-shaped portion, the middle section further comprises a protruded folded portion that engages with the trench in the base of the radiator, and the distal end further comprises a horizontal extended folded portion parallel to the protruded folded portion.

5. The retainer for a retaining seat of a radiator as claimed in claim 1, wherein a front end of the pivotal seat has a stopper.

6. The retainer for a retaining seat of a radiator as claimed in claim 5, wherein the stopper at the front end of the pivotal seat comprises a block rotates to a predetermined angle, the pressing strip is confined by the block to be secured within the pivotal seat such that the pressing strip will not drop out from the pivotal seat.

* * * * *